United States Patent [19]

Ishizuka et al.

[11] Patent Number: 5,784,497
[45] Date of Patent: Jul. 21, 1998

[54] ARITHMETIC ENCODING WITH CARRY OVER PROCESSING

[75] Inventors: Keiji Ishizuka, Kawasaki; Atsushi Furuya, Sagamihara, both of Japan

[73] Assignee: Canon Kabushiki Kaisha, Tokyo, Japan

[21] Appl. No.: 611,497

[22] Filed: Mar. 6, 1996

Related U.S. Application Data

[63] Continuation of Ser. No. 150,804, Nov. 12, 1993, abandoned.

[30] Foreign Application Priority Data

Nov. 13, 1992 [JP] Japan ................. 4-303932

[51] Int. Cl.$^6$ ............... G06K 9/36; G06K 9/46
[52] U.S. Cl. ............. 382/247; 341/107; 364/736.01
[58] Field of Search .................. 382/247, 232, 382/234, 244; 364/715.02, 736.01, 1, 739, 741; 358/261.1, 261.2; 348/384, 390; 371/49.1, 37.6; 341/107

[56] References Cited

U.S. PATENT DOCUMENTS

| | | | |
|---|---|---|---|
| 4,286,256 | 8/1981 | Langdon, Jr. et al. | 340/347 |
| 4,463,342 | 7/1984 | Langdon, Jr. et al. | 341/107 |
| 4,467,317 | 8/1984 | Langdon, Jr. et al. | 341/107 |
| 4,870,695 | 9/1989 | Gonzales et al. | 382/56 |
| 4,891,643 | 1/1990 | Mitchell et al. | 341/107 |
| 4,905,297 | 2/1990 | Langdon, Jr. et al. | 382/56 |
| 4,926,266 | 5/1990 | Kurosawa | 382/56 |
| 4,973,961 | 11/1990 | Chamazas et al. | 341/51 |
| 5,262,873 | 11/1993 | Ishizuka | 358/443 |
| 5,298,896 | 3/1994 | Lei et al. | 341/51 |
| 5,555,323 | 9/1996 | Hongu | 382/247 |

OTHER PUBLICATIONS

IBM Journal Of Research And Development, vol. 28, No. 2, Mar. 1984, New York US, pp. 135–149, Langdon, Jr. "An Introduction to Arithmetic Coding".

IBM Technical Disclosure Bulletin, vol. 23, No. 1, Jun. 1980, New York US, pp. 310–312, Langdon, Jr. "Method for Carry-Over in a FIFO Arithmetic Code String".

*Primary Examiner*—Bipin Shalwala
*Attorney, Agent, or Firm*—Fitzpatrick, Cella, Harper & Scinto

[57] ABSTRACT

An image encoding device for effecting the carryover process on a real-time basis in arithmetic encoding, and without interruption in the function of the arithmetic encoder. The device is provided with an encoder for outputting code data, encoded by arithmetic codes, in succession by a predetermined number of bits, shift registers for retaining plural sets of the code data output from the encoder, and a processor for applying a carry-over process to the thus retained plural sets of code data.

16 Claims, 13 Drawing Sheets

FIG. 10

| RANGE OF A | NUMBER OF SHIFTS |
|---|---|
| 1 | 15 |
| 2 TO 3 | 14 |
| 4 TO 7 | 13 |
| 8 TO FH | 12 |
| 10H TO 1FH | 11 |
| 20H TO 3FH | 10 |
| 40H TO 7FH | 9 |
| 80H TO FFH | 8 |
| 100H TO 1FFH | 7 |
| 200H TO 3FFH | 6 |
| 400H TO 7FFH | 5 |
| 800H TO FFFH | 4 |
| 1000H TO 1FFFH | 3 |
| 2000H TO 3FFFH | 2 |
| 4000H TO 7FFFH | 1 |

VALUE OF CT BEFORE RE-NORMALIZATION

NUMBER OF SHIFTS

| | 1 | 2 | 3 | 4 | 5 | 6 | 7 | 8 |
|---|---|---|---|---|---|---|---|---|
| 1 | 1/8 | 0/1 | 0/2 | 0/3 | 0/4 | 0/5 | 0/6 | 0/7 |
| 2 | 1/7 | 1/8 | 0/1 | 0/2 | 0/3 | 0/4 | 0/5 | 0/6 |
| 3 | 1/6 | 1/7 | 1/8 | 0/1 | 0/2 | 0/3 | 0/4 | 0/5 |
| 4 | 1/5 | 1/6 | 1/7 | 1/8 | 0/1 | 0/2 | 0/3 | 0/4 |
| 5 | 1/4 | 1/5 | 1/6 | 1/7 | 1/8 | 0/1 | 0/2 | 0/3 |
| 6 | 1/3 | 1/4 | 1/5 | 1/6 | 1/7 | 1/8 | 0/1 | 0/2 |
| 7 | 1/2 | 1/3 | 1/4 | 1/5 | 1/6 | 1/7 | 1/8 | 0/1 |
| 8 | 1/1 | 1/2 | 1/3 | 1/4 | 1/5 | 1/6 | 1/7 | 1/8 |
| 9 | 2/8 | 1/1 | 1/2 | 1/3 | 1/4 | 1/5 | 1/6 | 1/7 |
| 10 | 2/7 | 2/8 | 1/1 | 1/2 | 1/3 | 1/4 | 1/5 | 1/6 |
| 11 | 2/6 | 2/7 | 2/8 | 1/1 | 1/2 | 1/3 | 1/4 | 1/5 |
| 12 | 2/5 | 2/6 | 2/7 | 2/8 | 1/1 | 1/2 | 1/3 | 1/4 |
| 13 | 2/4 | 2/5 | 2/6 | 2/7 | 2/8 | 1/1 | 1/2 | 1/3 |
| 14 | 2/3 | 2/4 | 2/5 | 2/6 | 2/7 | 2/8 | 1/1 | 1/2 |
| 15 | 2/2 | 2/3 | 2/4 | 2/5 | 2/6 | 2/7 | 2/8 | 1/1 |

Legend: NUMBER OF OUTPUT BYTES / NEW VALUE OF CT

FIG. 12

ARITHMETIC ENCODING WITH CARRY OVER PROCESSING

This application is a continuation, of application Ser. No. 08/150,804, filed Nov. 12, 1993, now abandoned.

BACKGROUND OF THE INVENTION

1. Field of the Invention

The present invention relates to an image encoding device for compression encoding of image data, and more particularly to an image encoding device for encoding image data utilizing arithmetic codes.

2. Related Background Art

The arithmetic codes are utilized for example for image compression by adaptive prediction, as described in ISO/IEC (Committee Draft 11544) etc.

FIG. 1 shows an example of the encoding circuit utilizing arithmetic codes.

The binary data I of an object pixel to be encoded is supplied to an exclusive OR gate 904. Also the binary data X of plural reference pixels in the vicinity of the object pixel are supplied to a predictive state memory 901, which supplies the exclusive OR gate 904 with a predictive pixel data "0" or "1" according to the state of the reference pixel data. The exclusive OR gate 904 checks whether the object pixel data I coincides with the predictive pixel data from the predictive state memory 901, and supplies an arithmetic encoder 903 with the result.

The arithmetic encoder 903 is provided with an interval size register (A register) indicating the current coding interval and a code register (C register), and shifts the values of said A and C registers according to the output of the exclusive OR gate 904. Then values of consecutive 8 bits in a specified position in the C register are output as encoded data.

The content of the predictive state memory 901 is renewed according to an instruction of a prediction renewal unit 902, receiving the result of encoding, including the value of the A register of the arithmetic encoder 903. Consequently, the predictive state memory 901 supplies the exclusive OR gate 904 with the predictive pixel data adaptively to the current encoding operation.

FIG. 2 is a flow chart of the encoding operation of the encoder 903.

It is assumed that the A and C registers in the encoder 903 have a capacity of 32 bits each, and a section A is defined as 0 (0000H)–0.5 (8000H)–1.0 (10000H), wherein H stands for a hexadecimal number.

The exclusive OR gate 904 compares the object pixel data with the predictive pixel data, and there is discriminated whether both data mutually coincide (S201). In case of coincidence, there is executed re-normalization as shown in FIG. 4, and, in case of noncoincidence, there is executed re-normalization as shown in FIG. 5. FIG. 3 shows the sequence of re-normalization.

The re-normalization shown in FIG. 3 is executed in case the object pixel data and the predictive pixel data do not mutually coincide, and also in case both data mutually coincide and the value A of the A register is less than 0.5 (8000H).

At first, in order to double the contents of the A and C registers, the contents of the registers are shifted by a bit in the direction of the MSB, and the count of a CT counter, counting the number of shifts, is decreased by "1" (S301). In the present example, the data in a specified position of the C register are taken out as the encoded data at every eight shifts, in order to handle the encoded data as 8-bit parallel data. Thus a value "8" is initially set in the CT counter, and the count is decreased stepwise at each 1-bit shift of the A register. The 8-bit encoded data are obtained when the count of the CT counter reaches "0".

Thus, there is discriminated whether the value of the CT counter is "0" (S302), and, if "0", the 8-bit encoded data are taken out from the C register and released (S303), but, if not "0", the encoded data are not output.

Then, it is discriminated whether the value A of the A register, after 1-bit shift, is less than 0.5 (8000H) (S304), and, if not, the re-normalization is terminated. On the other hand, if the value A of the A register is less than 0.5 (8000H), the sequence returns to the step S301 to effect again the 1-bit shifts of the A and C registers and the stepwise subtraction of the CT counter. These shifts are repeated until the value A of the A register becomes less than 0.5 (8000H).

In the following there will be explained the transition of state of the A register in the re-normalization, with reference to FIGS. 4 and 5.

If the object pixel data coincides with the predictive pixel data, a constant LSZ (least significant coding interval) is subtracted from the value A of the A register (S202). Then there is discriminated whether the value A of the A register is smaller than 0.5 (8000H) (S203), and, if not, the encoding operation is terminated through a path 2 (phases 1, 2 in FIG. 4).

If the value A of the A register is smaller than 0.5 (8000H), the sequence proceeds through a path 1 to add the value A of the A register to the value C of the C register (S204). Then, the re-normalization shown in FIG. 3 is executed in order to bring the value A, which is less than 0.5 (8000H) to a value equal to or larger than 0.5 (8000H), by shifting the A and C registers (S205). In this manner the contents of the A and C registers are renewed (phase 3 in FIG. 4). In this state, the count of the CT counter, counting the number of shifts of the A register, reaches "0", whereupon the upper byte of the C register is output as the encoded data.

On the other hand, if the object pixel data does not coincide with the predictive pixel data, the sequence proceeds through a path 3 to define the value A of the A register as the constant LSZ (S206) and to execute the re-normalization shown in FIG. 3 by shifting the A register until the value A thereof becomes equal to or larger than 0.5 (8000H) (phases 1, 2, 3, 4 in FIG. 5). In the example shown in FIG. 5, the A register is shifted three times. In this manner the content of the A register is renewed. The C register is also likewise shifted. In the example shown in FIG. 5, the count of the CT counter reaches "0" at the first shift, whereupon the upper byte of the C register is outputted as the encoded data, and then the C register is set at "8".

In the above-described encoding circuit utilizing the arithmetic codes, the value C shifted in the C register is output, in 8-bit unit, as the encoded data. The value C is added, as shown in the step S204 in FIG. 2, to the value A. Consequently, the addition of a certain value C and a certain value A may result in a sum exceeding FFH. In such case, the carry-over will influence at least the preceding 8-bit encoded data. Consequently the 8-bit data from the C register cannot be directly supplied as the encoded data to the transmission channel or the like, and, if the addition of the values C and A exceeds FFH, this may result in a carry-over, such carry-over has to be absorbed by a suitable method.

As a method for realizing this purpose, there is known the so-called carry-over waiting method in which a code bit train output from the encoding register is not transmitted but stored if it has the possibility of carry-over.

This carry-over waiting method will be explained in the following by an example.

FIG. 6 shows a circuit for the carry-over waiting method. In case of a re-normalization in an arithmetic encoder 903, the output a thereof is stored in a TEMP register 302. The output a is a 9-bit data including carry-over. The output b of the TEMP register 302 is the carry-over bit, and the output c is an 8-bit data not including the carry-over bit. The output b is supplied to carry-over discrimination circuit 303, which releases an H (High) level or an L (Low) level in the output j respectively when the carry-over is present or absent. The output c is supplied to an FF discrimination circuit 304 for discriminating whether c is equal to FFH, and to a buffer register 305 for storing the output c. The FF discrimination circuit 304 releases a clock d for an increment of an SC counter 306 in case c is equal to FFH, and a clock e for storing c in the buffer register 305 in case c is not equal to FFH.

For the purpose of simplicity, the function will be explained by an example.

It is assumed that the SC counter 306 has been reset with an output k=0, and that the buffer register 305 stores C3H. At the next re-normalization, the output of the arithmetic encoder 903 is stored in a TEMP register 302, and the stored value is assumed as BAH. In case of storage of BAH, since the carry-over bit is not included, b is "0" and c is BAH. Consequently the carry-over discrimination circuit 303 releases an output "L", and the FF discrimination circuit 304 does not output the clock d to increment the SC counter 306 but releases the clock e for storing the signal c in the buffer register 305.

An adder 307 executes a logic S=A+B. Before the re-normalization, the buffer register 305 stores C3H, and, after the re-normalization, the carry-over discrimination circuit 303 releases an output j=L, so that a switch 308 is positioned at the L-side while the adder 307 receives 00H at the input B. Consequently the adder 307 releases an output g=C3H.

A control circuit 309 outputs control signals h, i determining the functions of switches 310, 311 according to the logic values of j, k. In the case of j =L, k=00H, the signal i is L and the switch 311 is positioned at the L side. Consequently there is released a signal C3H at the output o.

In the following there will be described another case. In the above-explained sequence, let consider again the situation where the buffer register stores C3H and the re-normalization has been executed again. It is now assumed that the TEMP register 302 stores FFH instead of BAH. Since there is no carry-over, b=0 and c=FFH. Since c=FFH, the FF discrimination circuit 304 releases a clock d for executing an increment of the SC counter 306. However, there is not outputted the clock e is not output for storing the value of the TEMP register 302 into the buffer register 305. Consequently the output f of the buffer register 305 is still C3H. If the output of the arithmetic encoder 903 at the next re-normalization is still FFH, the SC counter 306 undergoes another increment, while the buffer register 305 still stores C3H. If the value FFH continues for n times of re-normalizations, the output k of the SC counter 306 becomes n, while the output f of the buffer register 305 remains as C3H. It is now assumed that, at the next re-normalization, 3EH is stored in the TEMP register 302.

Since there is no carry-over and no coincidence with FFH, C3H is issued at the output o. Thus the control circuit 309 outputs the signals h=L and i=H. FFH is issued n times at the output o. Then the SC counter 306 is reset, and 3EH is stored in the buffer register 305. During the output of FFH by n times, new encoded data cannot be fetched, so that the preceding encoding process is temporarily suspended.

Consider still another case. Consider again a situation where the buffer register 305 stores C3H and the SC counter 306 releases an output n. It is now assumed that 13EH is stored in the TEMP register 302 at the next re-normalization. The register 302 releases an output b=1, so that the carry-over discrimination circuit 303 identifies the presence of carry-over to release an output j=H. Thus, the switch 308 is shifted to the H side, and 01H is supplied to the adder 307 which thus releases an output g=C4H released from the output o. Subsequently, the control circuit 309 shifts the signals h, i to H level, and 00H is output n times according to the count of the SC counter. The count of the buffer register 302 becomes 3EH, and the SC counter 306 is reset. Also during the output of 00H by n times, the new encoded data cannot be fetched, so that the preceding encoding process is temporarily suspended.

In the foregoing description, the count of the SC counter 306 is assumed as n, but the same explanation applies to any value of n equal to or larger than 0.

FIG. 7 is a flow chart showing the sequence of the carry-over waiting method.

In synchronization with the re-normalization of the A (Augend) register (S2), the data of the C (Code) register are output in 8-bit (1 byte) unit or in a carry-over bit+8-bit unit and are stored in the TEMP register (S3). If the content of the TEMP register is smaller than FFH (S4), the content is stored in the buffer register. Since the next data to be output from the C register may result in a carry-over, the content of the buffer register is not output, but a waiting state is entered (S6). If the next data output from the C register and stored in the TEMP register is smaller than FFH, there is no longer the possibility of carry-over for the buffer register, so that the content of the buffer register is output as the encoded data, and the content of the TEMP register is newly fetched in the buffer register.

Then, if the content of the TEMP register is FFH (S5), the next data from the C register may generate a carry-over, so that the content of the buffer register cannot be output and the waiting state is therefore continued (S7). In this state, the count of the SC counter, indicating the number of storages of FFH into the TEMP counter, is increased by one. In case the data from the encoding register is consecutively FFH, the output from the buffer register is suspended, and the SC counter counts the number of storages of FFH in the TEMP register. If the count of the TEMP register in this state is smaller than FFH, the carry-over is not generated, so that the content of the buffer register is output. Thus FFH is output by the number of times counted by the SC counter, then the content of the TEMP register is newly stored in the buffer register, and the SC counter is cleared. If the content of the TEMP register is larger than FFH, thus generating a carry-over (S4), the carry-over propagates to the buffer register. Thus there is output the content of the buffer register +1, and 00H is output by a number of times counted by the SC counter. The buffer register stores the content of the TEMP register, excluding the carry-over bit, and the SC counter is cleared (S8).

As will be apparent from the sequence shown in FIG. 7, in the output of FFH by the number of times counted by the SC counter in the step S6 or in the output of 00H by the number of times counted by the SC counter in the step S8, the next encoding process can only be started after the output of FFH or 00H. Consequently the encoding process is temporarily suspended during such output of FFH or 00H by the number of times counted by the SC counter.

In the above-described encoding device of the carry-over waiting method, if the carry-over propagates to the released encoded data, the encoded data is released by interrupting the encoding process. For this reason such device has been associated with a drawback of being incapable of the real-time processing (for example in a facsimile apparatus, reading an original document with a sensor and simultaneously encoding the binarized data with an encoder), and it has been necessary to interrupt the original reading or to effect the encoding after the binarized data are stored in a memory. For this reason there has been required a long time for encoding, or a memory for storing the binarized data.

SUMMARY OF THE INVENTION

In consideration of the foregoing, an object of the present invention is to provide an image encoding device enabling real-time process in arithmetic encoding, and a method therefor.

Another object of the present invention is to provide an image encoding device capable of promptly and efficiently executing the carry-over process in the encoding utilizing arithmetic codes without influencing the preceding encoding, and a method therefor.

Still another object of the present invention is to provide an image encoding device capable of executing the above-mentioned carry-over process, without temporary interruption of the preceding encoding process, and a method therefor.

The above-mentioned objects can be attained, according to the present invention, by an image encoding device comprising:

output means for consecutively outputting, by a predetermined number of bits, data encoded utilizing arithmetic codes;

retention means for retaining plural sets of encoded data of the predetermined number of bits, output in succession from said output means; and process means for effecting a carry-over process to the plural sets of the encoded data of the predetermined number of bits, retained by said retention means.

Still other objects of the present invention, and the features thereof, will become fully apparent from the following description.

BRIEF DESCRIPTION OF THE DRAWINGS

FIG. 10 is a chart showing the number of shifts for re-normalization;

FIG. 12 is a chart showing values retained in a CTV register;

DESCRIPTION OF THE PREFERRED EMBODIMENTS

Now the present invention will be clarified in detail by preferred embodiments thereof.

Figure 1:
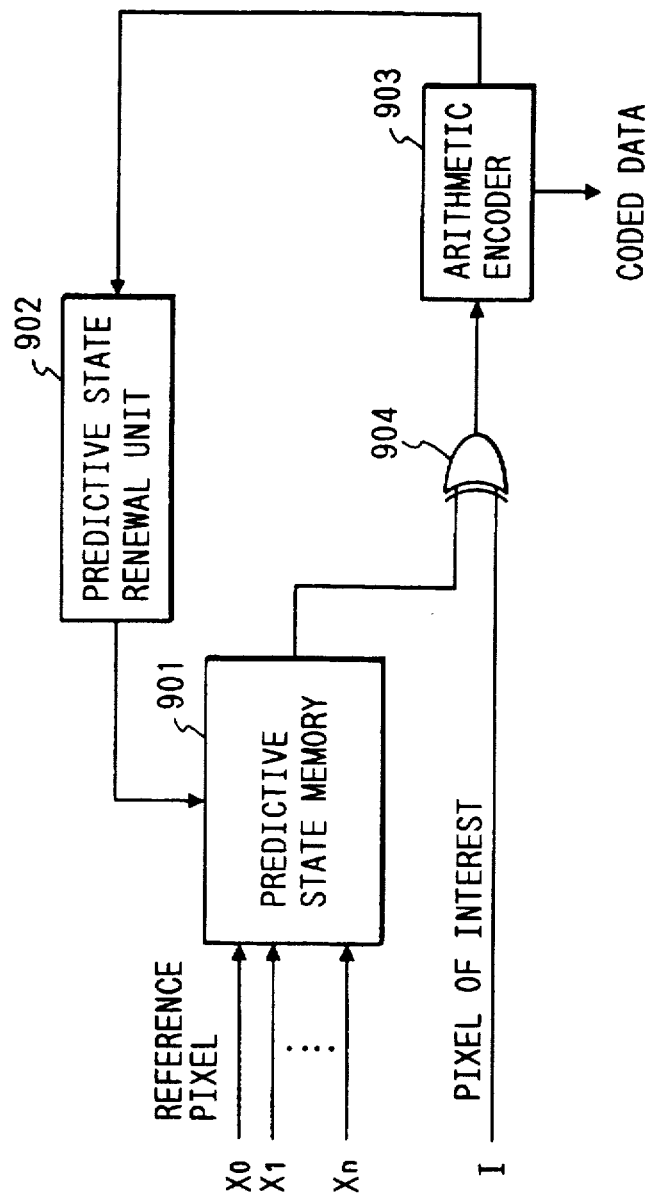
FIG. 1 is a block diagram of an example of the encoding circuit utilizing arithmetic codes.
Figure 2:
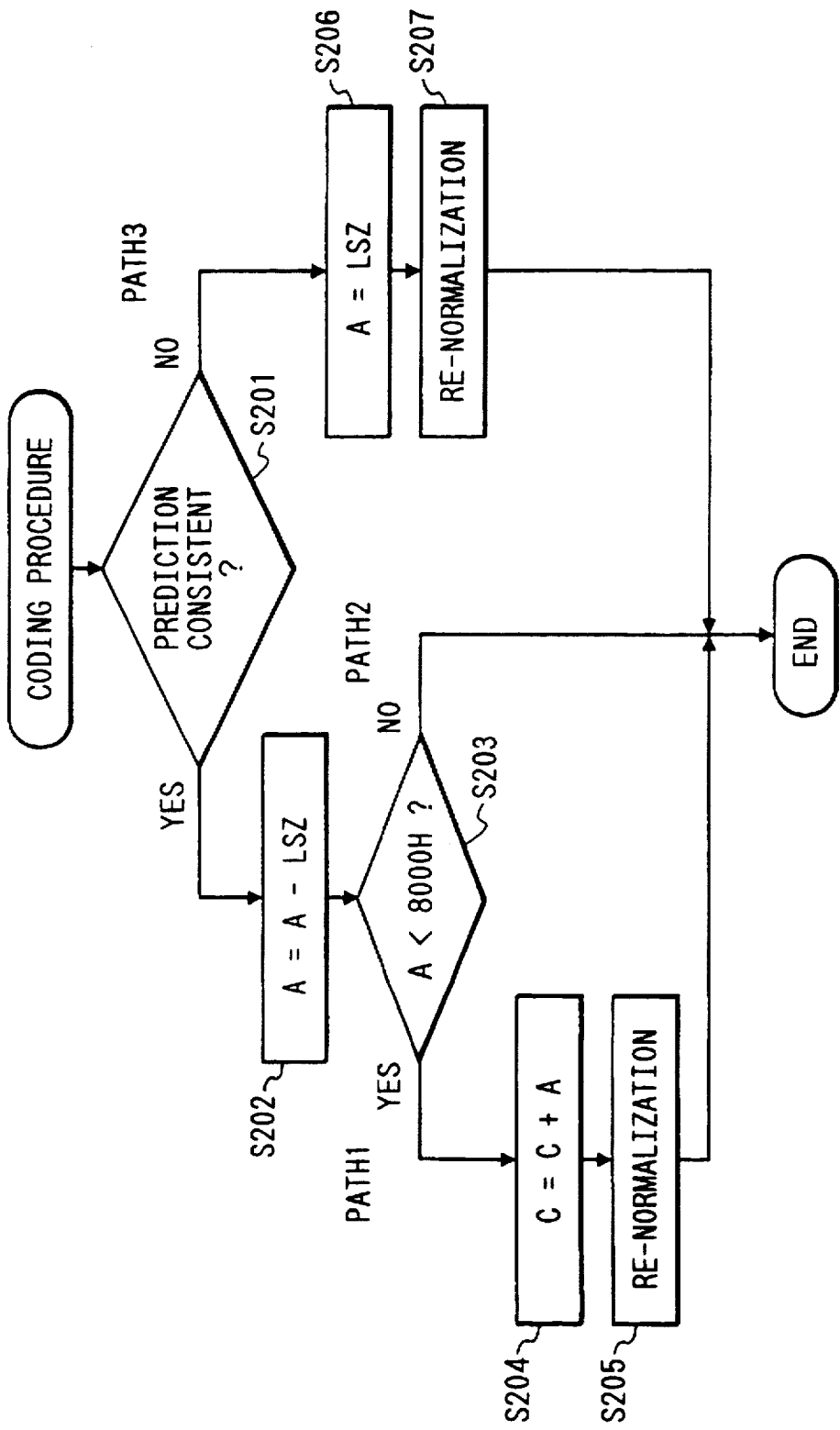
FIG. 2 is a flow chart showing the encoding sequence by arithmetic codes.
Figure 3:
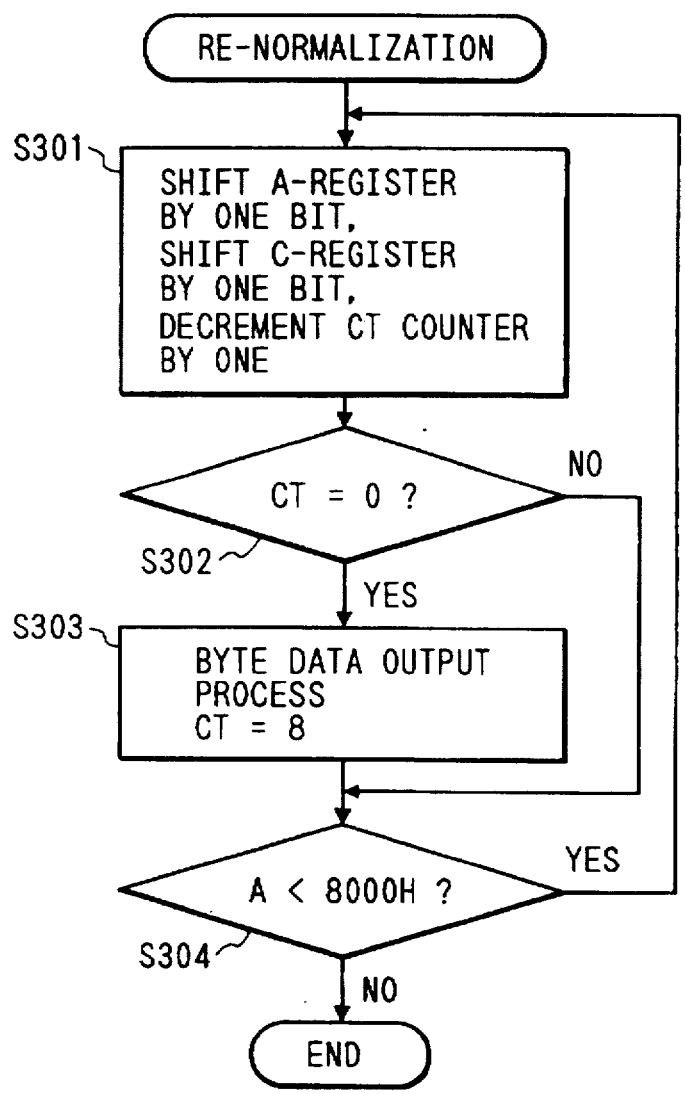
FIG. 3 is a flow chart showing the sequence of re-normalization in arithmetic codes.
Figure 4:
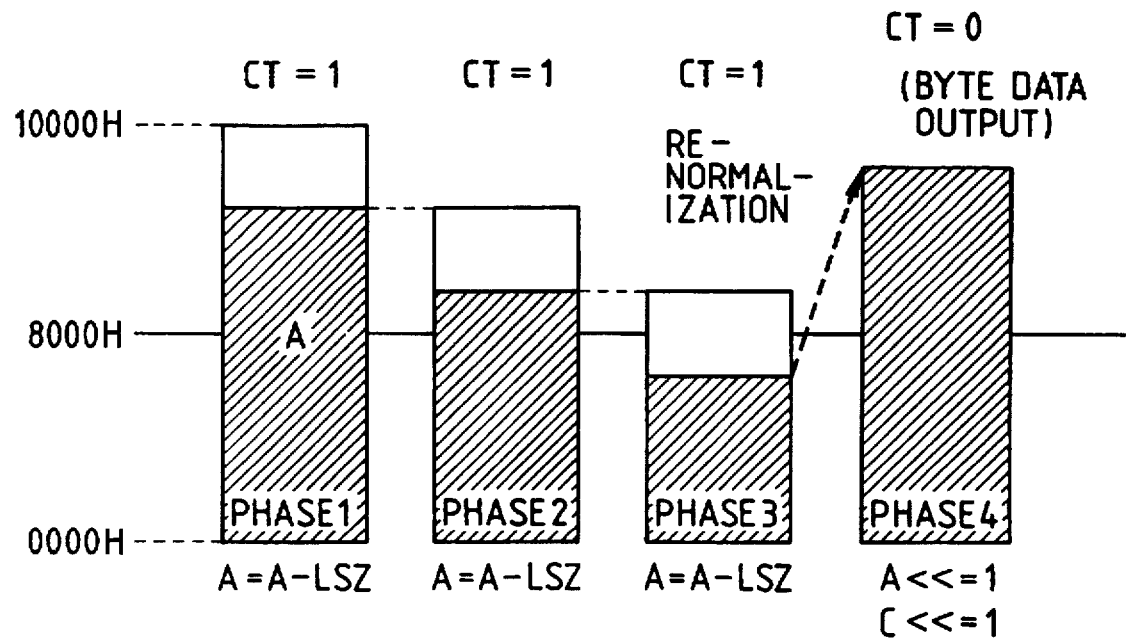
FIGS. 4 and 5 are views showing re-normalizing operations.
Figure 5:
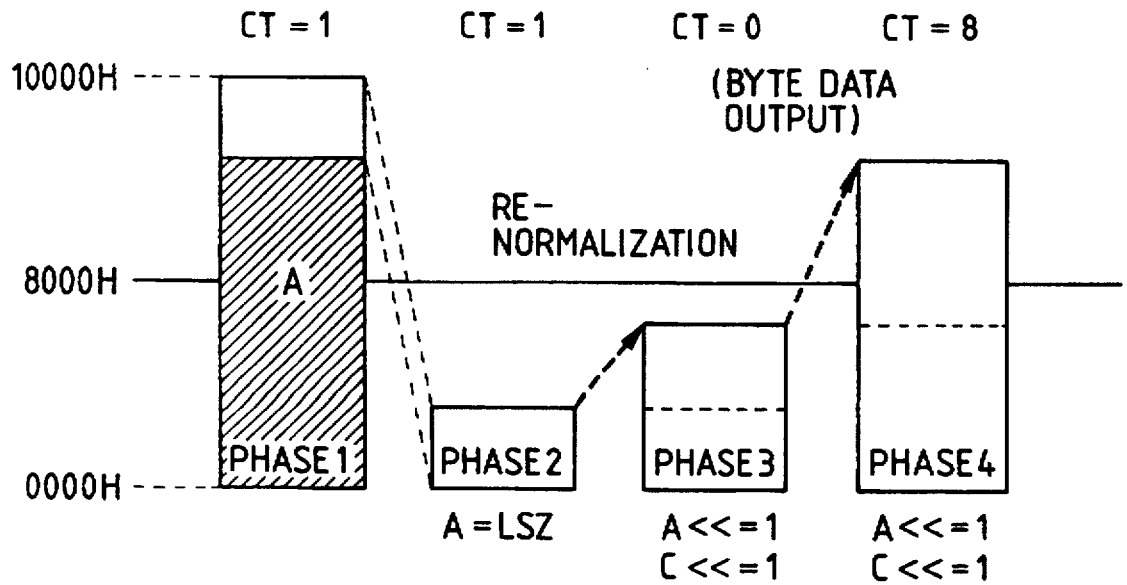
Figure 6:
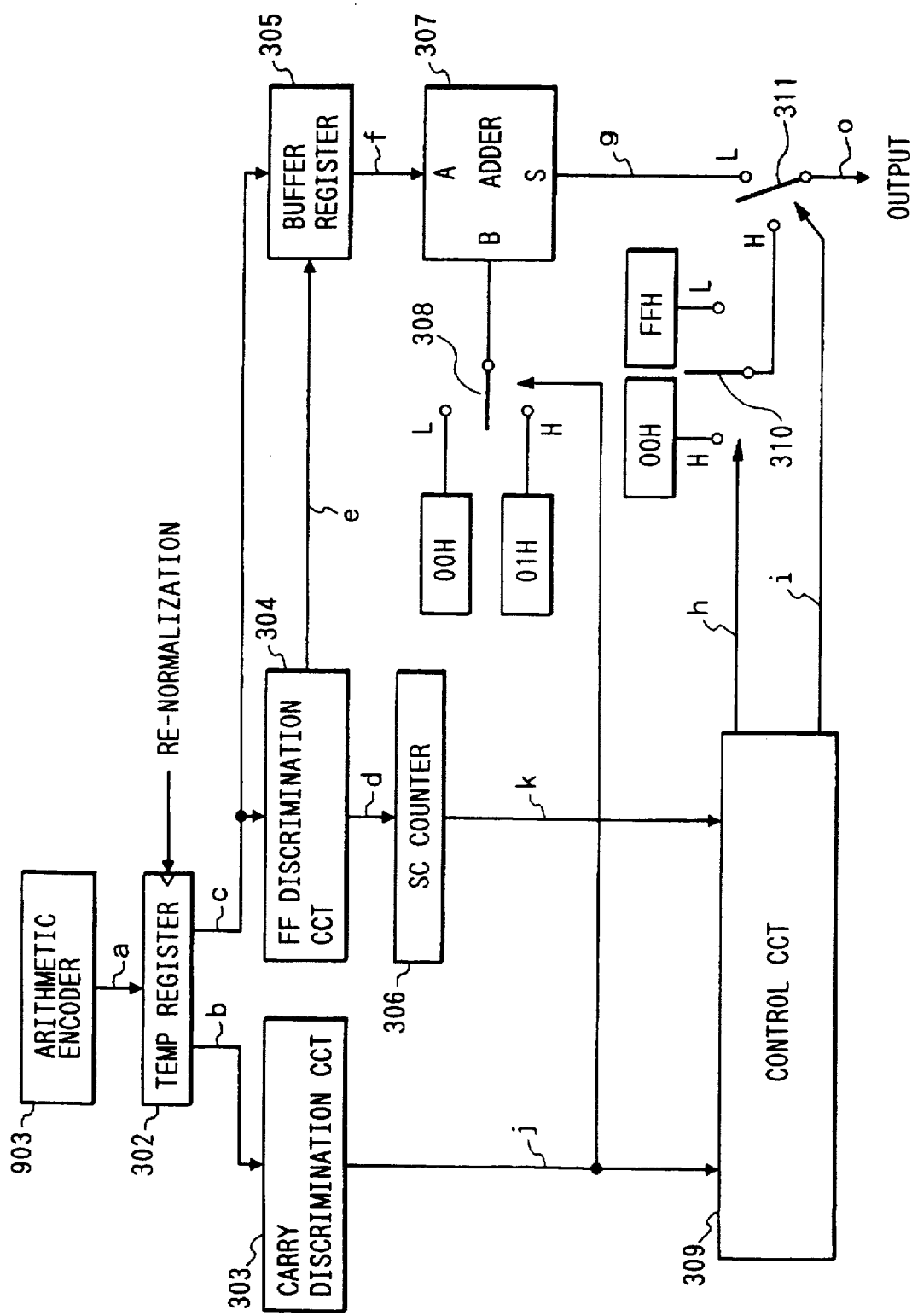
FIG. 6 is a block diagram of a circuit for a carry-over process in arithmetic codes.
Figure 7:
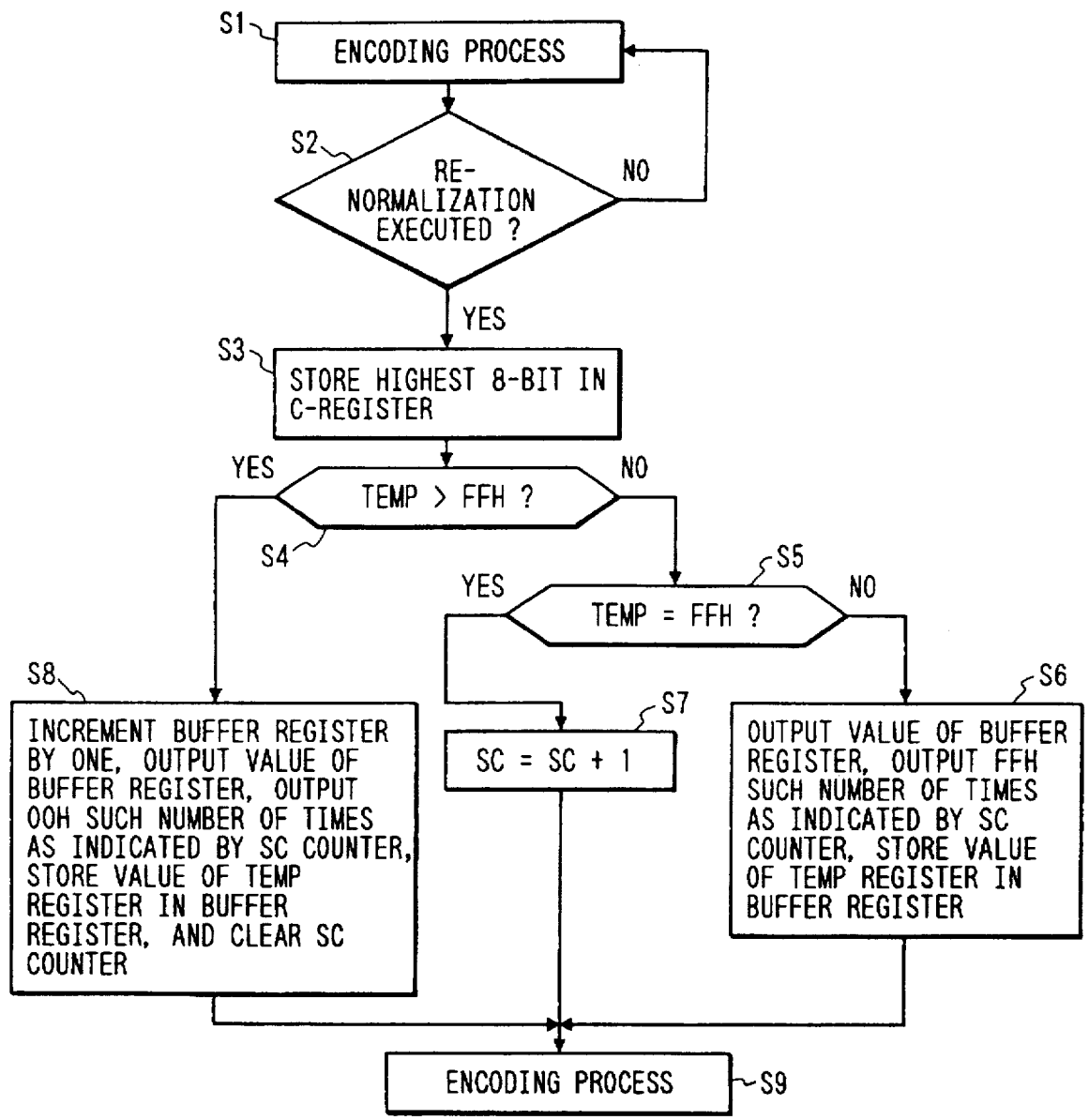
FIG. 7 is a flow chart showing the sequence of the carry-over process.
Figure 8:
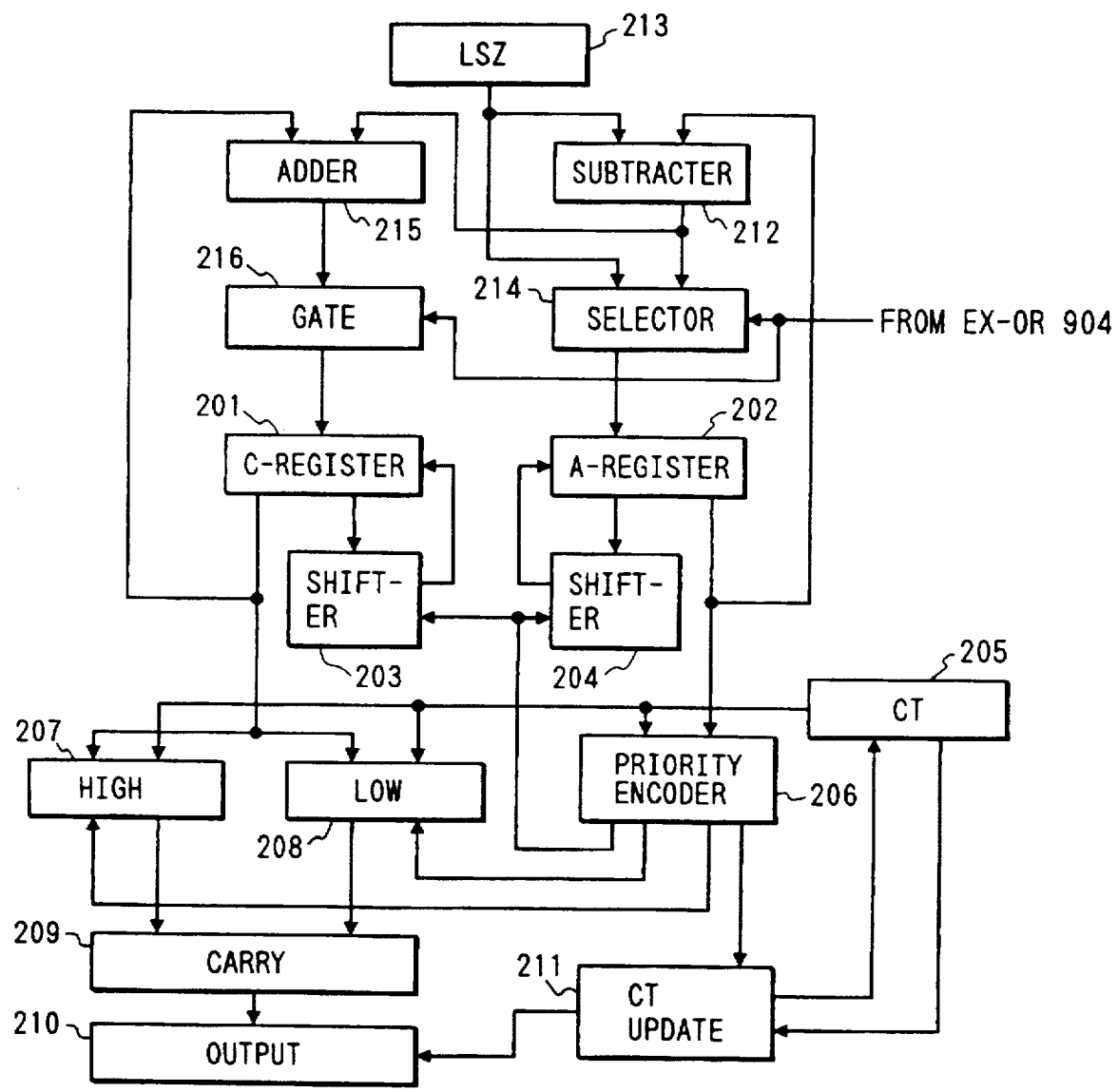
FIG. 8 is a block diagram of an arithmetic encoding circuit embodying the present invention.

FIG. 8 shows the configuration of an encoder embodying the present invention, and the encoder in FIG. 8 is utilized as the encoder 903 in FIG. 1 to constitute the image encoding device utilizing the arithmetic codes.

There are provided a 16-bit C register 201; a 16-bit A register 202 for storing data indicating the current coding interval which is one of the parameters employed for encoding of image data; barrel shifters 203, 204 respectively for a bit shift of the C register 201 and the A register 202; and a CT register 205 for retaining the CT value. In the configuration shown in FIG. 8, there is employed a counter for subtraction, but, the present embodiment utilizes a register for retaining the entered CT value.

A priority encoder 206 receives the output of the A register 202 and the CT register 205, controls the shifts of the barrel shifters 203, 204 and also controls a CT update logic 211 to renew the value of the CT register 205. It also controls a high-byte register 207 and a low-byte register 208 to control the output of the upper and lower bytes stored in the C register 201. There is also provided a carry-over control circuit 209.

The content of the A register 202 is subjected, in a subtractor 212, to the subtraction of LSZ from an LSZ generator 213, and the result of the subtraction is supplied to a selector 214. The selector 214 also receives the LSZ from the LSZ generator 214. The selector 214 selects either of the two inputs, according to the output of an exclusive OR gate 904, indicating coincidence or non-coincidence between the object pixel and the predictive pixel. More specifically, it selects the output (A - LSZ) from the subtractor 212 in case of coincidence, or the LSZ from the LSZ generator 213 in case of non-coincidence, and the selected signal is supplied to the A register 202 to renew the content thereof.

Also, the value of the C register 201 is added, in an adder 215, to the output (A - LSZ) of the subtractor 212 and is supplied to a gate 216, which supplies the output of the adder 215 to the C register 201, in response to the output of the exclusive OR gate 904 indicating the non-coincidence between the object pixel and the predictive pixel, whereby the content of the C register is renewed.

Since the value A of the A register at the execution of re-normalization is within a range $1 \leq A \leq 7FFFH$, the number of bits of shift can be uniquely be determined according to the range of A, as shown in FIG. 10. This can be represented as "finding '1' in a bit position closest to the MSB side within the bits of A register". Thus, the above-mentioned bit position can be detected by a priority encoder 206 as shown in FIG. 9.

Figure 9:
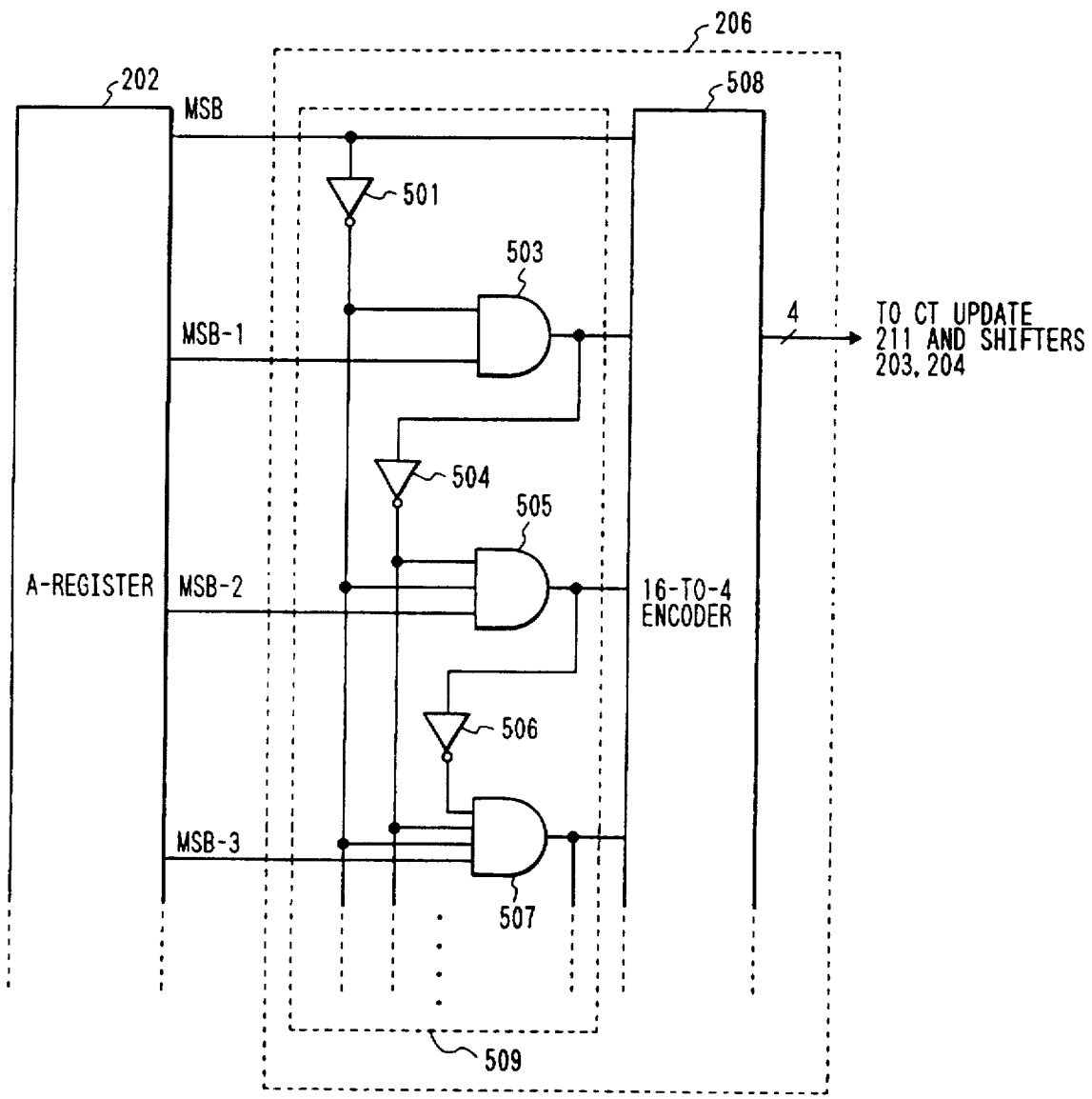
FIG. 9 is a block diagram showing an example of the priority encoder.

Referring to FIG. 9, the priority encoder 206 is composed of a logic circuit unit 509 and a 16 to 4 encoder 508. The bits stored in the A register 202 are taken out bit by bit in a parallel manner, and supplied to the logic circuit unit 509 composed of inverters 501, 504, 506, . . . and AND gates 503, 505, 507, . . . The logic circuit unit 509 is so constructed that a high-level output signal is obtained only from an AND gate, among those 503, 505, 507, . . . , corresponding to '1' of the bit position closest to the MSB, among those stored in the A register 202. Thus, if the A register 202 stores data "0101 . . . " the high-level output signal is obtained only from the AND gate 503, corresponding to the 2nd bit, or MSB −1, of the A register 202. The outputs of the AND gates 503, 505, 507, . . . are supplied to the 16-to-4 encoder 508, which releases 4-bit data indicating the bit position.

FIG. 10 shows the correspondence between the value of the A register 202 at the re-normalization and the number of shifts of the A register 202.

The number of shifts from the priority encoder 206 is supplied to the barrel shifters 203, 204, which accordingly shift the contents of the C register 201 and the A register 202 by 1 to 15 bits at a time.

Figure 11:
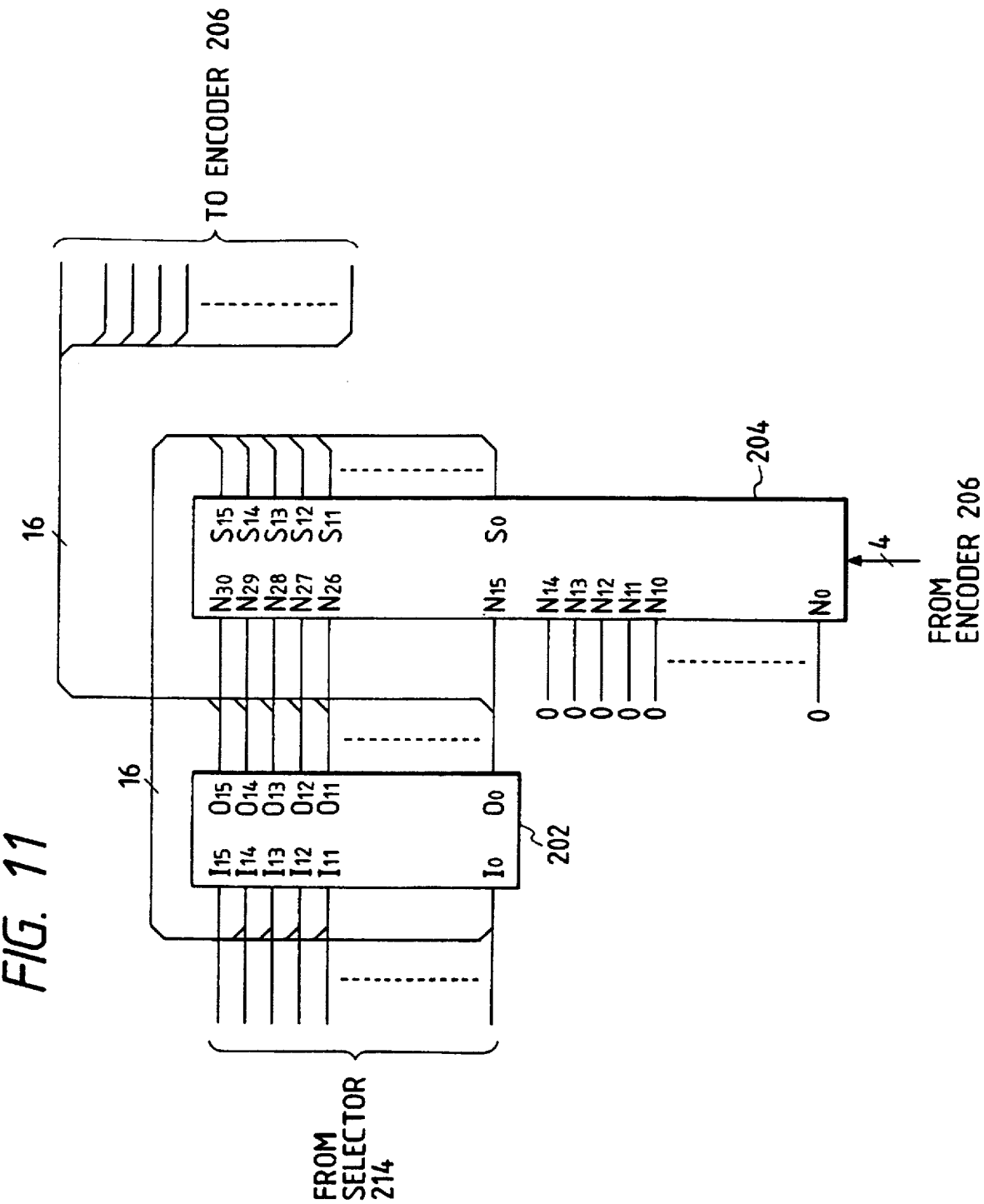
FIG. 11 is a block diagram showing the configuration of a barrel shifter and an A register.

FIG. 11 shows the structure of the barrel shifter 204 and the A register 202. The barrel shifter 203 and the C register 201 are also constructed in the same manner.

The 16-bit data stored in the A register 202 are supplied in a parallel manner to the barrel shifter 204. The lower 15 bits of the barrel shifter 204 receive "0".

The number of shifts from the priority encoder 206 is supplied to the barrel shifter 204, which selects and outputs arbitrary data of consecutive 16 bits, among the 31-bit input, according to the number of shifts. For example, if the priority encoder 26 enters a number of shifts of "3", the barrel shifter 204 selects $N_{27}, N_{26}, N_{25}, \ldots, N_{12}$ from the input of 31 bits and releases the 16-bit data to the output lines $S_{15}$ to $S_0$ in a parallel manner.

The 16-bit data output in the parallel manner from the barrel shifter 204 are supplied in a parallel manner to the A register 202 and retained therein.

Consequently, a shift of the number of bits, corresponding to the shift number instructed from the priority encoder 206, can be executed at a proper time.

The update logic 211 receives the number of shifts and the CT value before the re-normalization from the priority encoder 206, and outputs the output byte number and the CT value after the re-normalization.

FIG. 12 shows a correspondence table provided in the update logic 211. It will be understood that an output byte number of 0 to 2 can be obtained, depending on the number of shifts of 1 to 15 and the CT value of 1 to 8. These values are used, in an output control unit 210 shown in FIG. 8, for a control of no output for a value "0", the output of the codes of the high register 207 for a value "1", and the output of two bytes of the high-byte register 207 and the low-byte register 208 for a value "2".

Also the update logic 211 supplies the CT register 205 with a new CT value, which is retained therein.

As explained in the foregoing, the plural bit values in the A register 202 are monitored in a parallel manner, and, at the re-normalization, the shifts of plural bits in the A register 202 and the C register 201 are executed at a proper time. In this manner the time required for the re-normalization can be made constant regardless whether the object pixel data to be encoded coincides with the predictive pixel data and regardless of the content of the A register, so that the real-time synchronous encoding of the object pixel data to be encoded can be realized.

Figure 13:
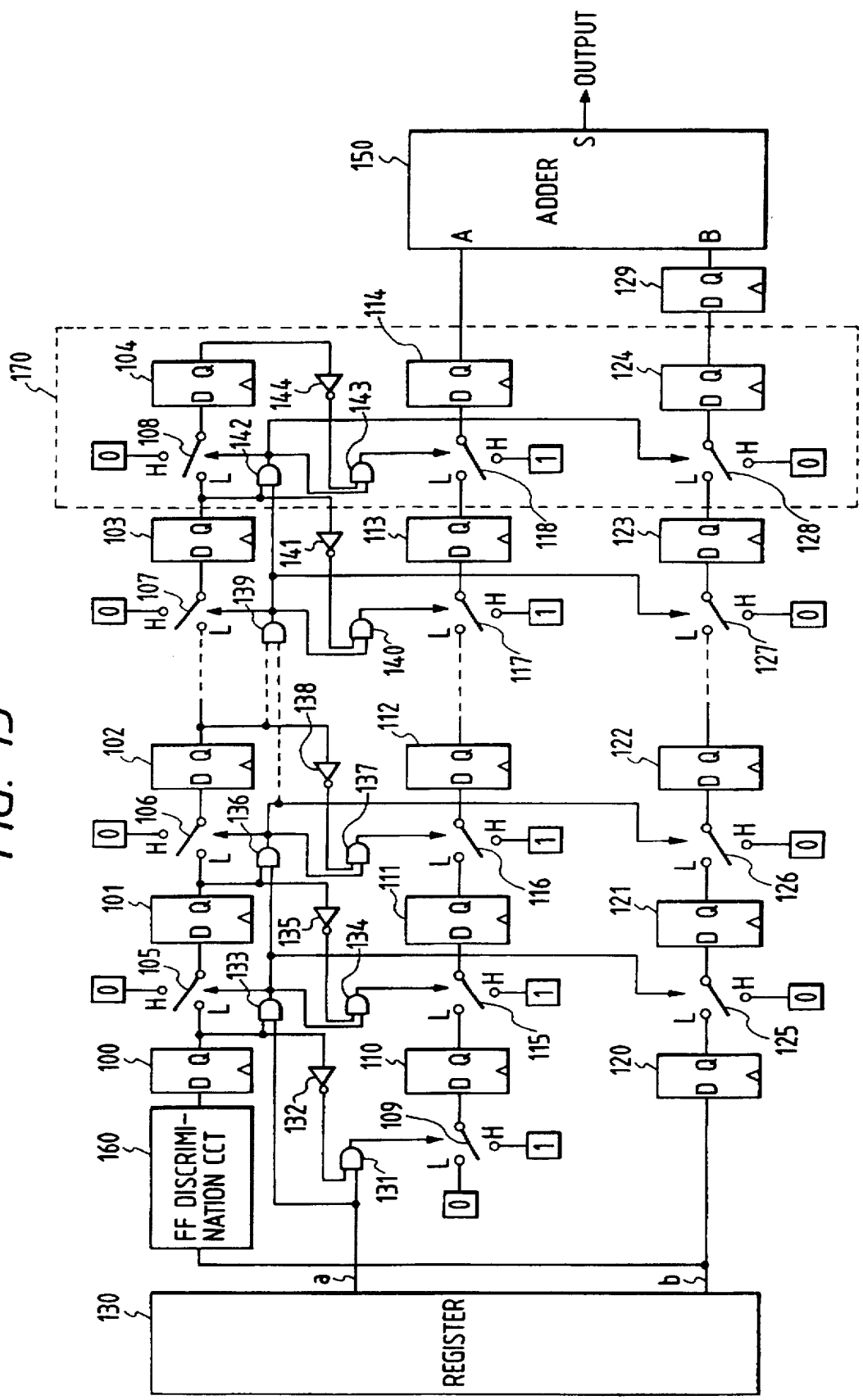
FIG. 13 is a circuit diagram showing an example of the carry-over control circuit of the present invention.

FIG. 13 shows the structure of the carry-over control circuit 209 in FIG. 8, wherein are provided flip-flops (F/F) 100 to 104, 110 to 114, 120 to 124 and 129; multiplexers or switches 105 to 109, 115 to 118 and 125 to 128; AND gates 131, 133, 134, 136, 137, 139, 140, 142 and 143; inverters 132, 135, 138, 141 and 144; a register 130 corresponding to the high-byte register 207 and the low-byte register 208 in FIG. 8; an adder 150; and an FF discrimination circuit 160. The broken-lined portion indicates repetition of similar circuits, consisting of serial connection of a required number of the circuit 170 framed in a chain-lined frame.

The functions of the above-explained circuitry will be explained as follows. The register 130 releases a code train according to the above-described encoding sequence and in synchronization with the re-normalization, wherein a is the carry-over data and b is data of at least a bit, excluding the carry-over. In the following description, the data b is assumed to be of 8 bits, as in the foregoing description.

The flip-flops (F/F) 100 to 104, 110 to 114, 120 to 124 and 129 latch the input data in synchronization with the re-normalization. Consequently the data are shifted from left to right, at each re-normalization. For the purpose of simplicity, the circuit 170 is assumed to be repeated 5 times so that the total number of shifts is five.

Also the code trains released from the register 130 at the re-normalizations are assumed to be C3H, BAH, FFH, FFH, 1AEH . . .

Prior to the encoding, the flip-flops (F/F) 100 to 104 are reset.

At the first re-normalization, the register 130 releases an output C3H without carry-over, so that the output a is "0" and the output b is C3H. The output b is latched in the F/F 120. The FF discrimination circuit 160, for discriminating whether the output b is equal to FFH, upon receiving C3H, releases an output "0", which is latched in the F/F 100. Also since the output a is "0", the AND gate 131 releases an output "0" whereby the switch 109 is shifted to the L-side and the value "0" is latched in the F/F 110.

At the second re-normalization, the register 130 releases an output BAH, so that the output a is "0" and the output b is BAH. Through operations similar to those in the first re-normalization, the F/F 100 releases an output "0", the F/F 110 releases an output "0" and the F/F 120 releases an output BAH. Also by shift operations, the F/F 101 releases an output "0", the F/F 111 releases an output "0" and the F/F 121 releases an output C3H.

At the third re-normalization, the register 130 releases an output FFH, so that the output a is "0" and the output b is FFH. The output b, being FFH, is discriminated as equal to FFH in the FF discrimination circuit 160, which therefore releases an output "1", which is latched in the F/F 100. Thus there are obtained outputs "1" from F/F 100, "0" from F/F 110, FFH from F/F 120, "0" from F/F 101, "0" from F/F 111, BAH from F/F 121, "0" from F/F 102, "0" from F/F 112, and C3H from F/F 122.

At the fourth re-normalization, the register 130 releases an output FFH, so that the output a is "0" and the output b is FFH. In a similar manner there are obtained outputs "1" from F/F 100, "0" from F/F 110, FFH from F/F 120, "1" from F/F 101, "0" from F/F 111, FFH from F/F 121, "0" from F/F 102, "0" from F/F 112, BAH from F/F 122, "0" from F/F 103, "0" from F/F 113 and C3H from F/F 123.

At the fifth re-normalization, the register 130 releases 1AEH including a carry-over, so that the output a of the register 130 is "1" and the output b is AEH. Since the F/F 100, 101 release "1" in this state, the AND gates 131, 134 release outputs "0" which are latched in the F/F 110, 111. Also since the F/F 100, 101 release outputs "1" while the F/F 102 releases an output "0", the carry-over signal from the register 130 is transmitted through the AND gates 133, 136 and 137, whereby the switch 116 is shifted to the H-side and the signal "1" is latched in the F/F 112. Also since the AND gates 133, 136 release outputs "1", the switches 105, 106 are shifted to the H-side whereby the F/F 101, 102 latch "0". Similarly the switches 125, 126 are shifted to the H-side, whereby the F/F 121, 122 latch 00H. Consequently, there are obtained the following outputs "0" from F/F 100, "0" from F/F 110, AEH from F/F 120, "0" from F/F 101, "0" from F/F 111, 00H from F/F 121, "0" from F/F 102, "1" from F/F 112, 00H from F/F 122, "0" from F/F 103, "0" from F/F 113, BAH from F/F 123, "0" from F/F 104, "0" from F/F 114, and C3H from F/F 124.

At the next re-normalization, the F/F 129 releases an output C3H while the F/F 114 releases an output "0". Because there is no carry-over, the adder 150 releases an output C3H, which is output as an established code output. At the next re-normalization, the F/F 129 releases an output BAH while the F/F 114 releases an output "1". Because there is a carry-over, the adder 150 releases an output BBH, which is output as an established code output. At the next re-normalization, the F/F 129 outputs 00H while the F/F 114 releases an output "0". Because there is no carry-over, the adder 150 releases an output 00H, which is output as the established code output. At the next re-normalization, the F/F 129 releases an output 00H, while the F/F 114 releases an output "0". Since there is no carry-over, the adder 150 releases an output 00H, which is output as the established code output.

Thereafter, the operations are conducted in similar manner to obtain established code outputs.

In the embodiment shown in FIG. 13, the output of the arithmetic encoder is assumed to be based on positive logic, but a similar object can be attained naturally through negative logic. Also the logic circuit composed of the multiplexers (switches), AND gates and inverters is not limited to that shown in FIG. 13, but an equivalent function can be attained by other logic circuits.

As explained in the foregoing, there are retained plural sets of code data, generated in succession in the unit of a predetermined number of bits (8 bits in this embodiment), and, in case a carry-over is generated, such carry-over is immediately absorbed by thus retained plural sets of code data. Consequently, the carry-over processing can be promptly executed without a particular interruption. Thus, such carry-over process avoids the influence on the preceding encoding process and enables efficient execution of such encoding process.

Also the foregoing embodiment enables, in the waiting method for the output of the arithmetic encoder, to dispense with the SC counter for counting the number of generation of the encoded data FFH.

Figure 14:
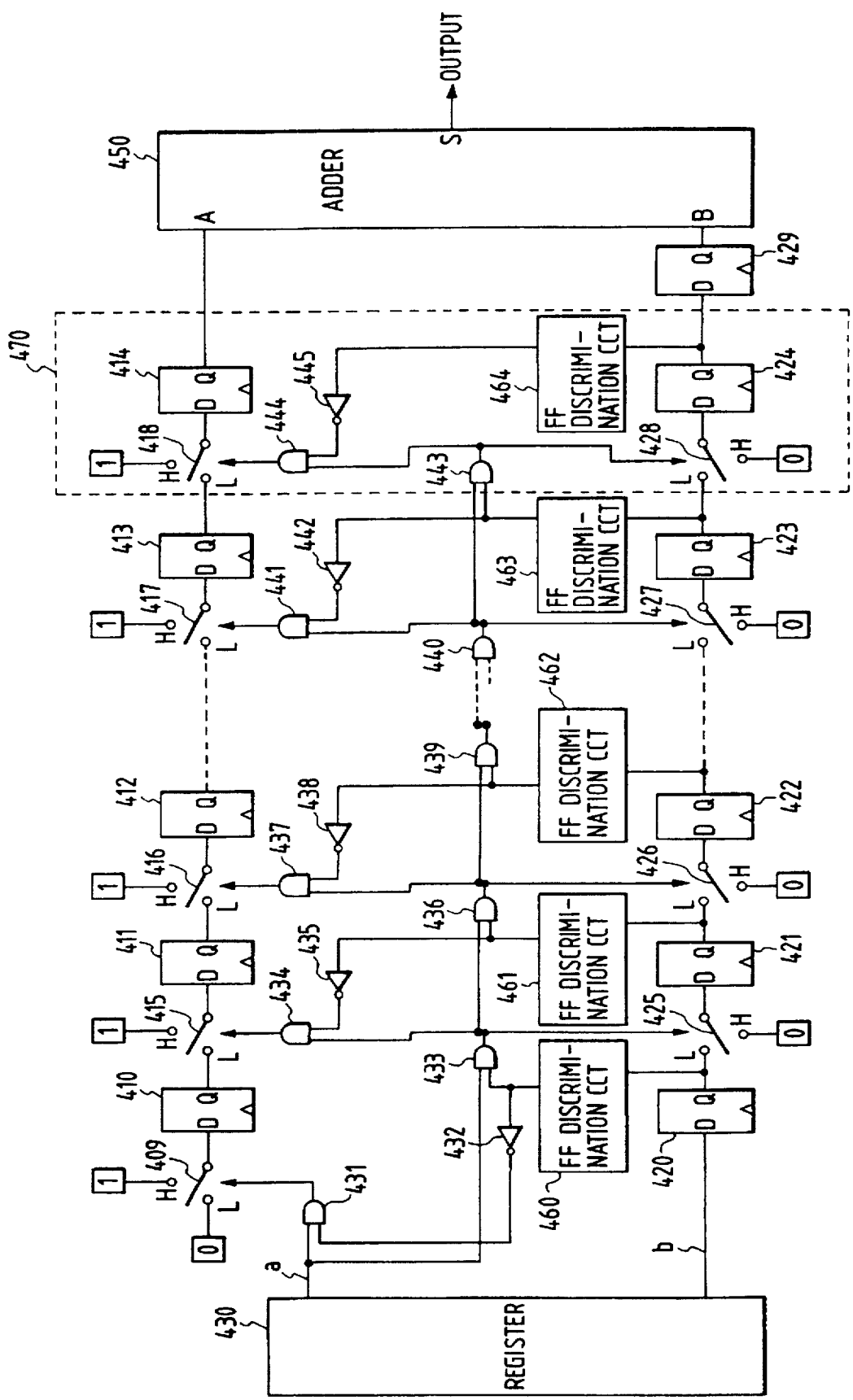
FIG. 14 is a circuit diagram showing another example of the carry-over control circuit of the present invention.

FIG. 14 shows another embodiment of the carry-over process circuit 209, wherein are provided flip-flops 410 to 414, 420 to 424 and 429; multiplexers or switches 409, 415 to 418, 425 to 428; AND gates 431, 433, 434, 436, 437, 439, 440, 441, 443 and 444; inverters 432, 435, 438, 442 and 445; a register 430 corresponding to the high-byte register 207 and the low-byte register 208 in FIG. 8; an adder 450; and FF discrimination circuits 460 to 464. The broken-lined portion indicates repetition of similar circuits, consisting of serial connection of a required number of the circuit 470 surrounded in a chain-lined frame.

It is different from the embodiment shown in FIG. 13, in that the FF discrimination circuit, for discriminating whether the output data of the register 430 is FFH, is provided at each output of the flip-flops 421 to 424, and this difference will be clarified further in the following description based on the same assumptions and conditions as in the foregoing description.

At the first re-normalization, the register 430 releases an output C3H without the carry-over, so that the output a is "0" and the output b is C3H. The output b is latched in the F/F 420. Since the AND gate 431 releases an output "0", the switch 409 is shifted to the L-side, and the F/F 410 latches "0".

At the second re-normalization, the register 430 releases an output BAH, so that the output a is "0" and the output b is BAH. Through operations similar to those in the first re-normalization, the F/F 410 releases an output "0", while the F/F 420 releases an output BAH. Also through shift operations, the F/F 411 releases an output "0", and the F/F 421 releases an output C3H.

At the third re-normalization, the register 430 releases an output FFH, so that the output a is "0" and the output b is FFH. There are consequently obtained the following outputs: "0" from F/F 410, FFH from F/F 420, "0" from F/F 411, BAH from F/F 421, "0" from F/F 412, and C3H from F/F 422.

At the fourth re-normalization, the register 430 releases an output FFH, so that the output a is "0" and the output b is FFH. There are obtained the following outputs: "0" from F/F 410, FFH from F/F 420, "0" from F/F 411, FFH from F/F 421, "0" from F/F 412, BAH from F/F 422, "0" from F/F 413, and C3H from F/F 423.

At the fifth re-normalization, the register 430 releases an output 1AEH including a carry-over, so that the output a is "1" and the output b is AEH. The FF discrimination circuits 460, 461, for respectively discriminating whether the outputs of the F/F 420, 421 are equal to FFH, upon receiving the outputs FFH from said F/F 420, 421, release outputs "1". Also since the output a is "1", the AND gates 433, 436 release outputs "1", whereby the switches 425, 426 are shifted to the H-side and the F/F 421, 422 latch "0". Also since the F/F 422 latches BAH, the FF discrimination circuit 462 releases an output "0", whereby the AND gate 437 releases an output "1" and the F/F 412 latches "1". Consequently, there are obtained the following outputs: "0" from F/F 410, AEH from F/F 420, "0" from F/F 411, 00H from F/F 421, "1" from F/F 412, 00H from F/F 422, "0" from F/F 413, BAH from F/F 423, "0" from F/F 414, and C3H from F/F 424.

At the next re-normalization, the F/F 429 releases an output C3H, while the F/F 414 releases an output "0". Since there is no carry-over, the adder 450 releases an output C3H, which is output as an established code output. Then, at the next re-normalization, the F/F 429 releases an output BAH while the F/F 414 releases an output "1". Since there is a carry-over, the adder 450 releases an output BBH, which is output as an established code output.

At the next re-normalization, the F/F 429 releases an output 00H while the F/F 414 releases an output "0". Since there is no carry-over, the adder 450 releases an output 00H, which is released as an established code output. At the next re-normalization, the F/F 420 releases an output 00H, while the F/F 414 releases an output "0". Since there is no carry-over, the adder 450 provides an output 00H, which is output as the established code output.

Thereafter, similar operations are executed to provide established code outputs.

As explained in the foregoing, there is provided means for delaying the code data trains, obtained by arithmetic codes, by plural steps by means of shift registers, and generating carry-over information and renewal code data by means of thus delayed code data trains. Thus, the carry-over can be absorbed by thus delayed code data trains, so that the carry-over process can be executed without the waiting time, and the arithmetic encoding can be realized on real-time basis.

Also since the SC counter, for counting the number of FFH in the code data train, can be dispensed with, there can be obtained a code train including the carry-over process, without interruption in the function of the arithmetic encoder. Because of the absence of interruption in the function of the arithmetic encoder, the data (for example binary image data) supplied to the arithmetic encoder can be encoded on a real-time basis.

Also since the arithmetic encoder can be realized with a circuit configuration synchronized with the input data, the arithmetic encoder can be designed more easily and in a more simplified manner.

The present invention has been described by preferred embodiments thereof, but it is naturally not limited to such embodiments and is subject to various modifications within the scope and spirit of the appended claims.

What is claimed is:

1. An image encoding device comprising:

encoding means for encoding image data based on an arithmetic code to generate code data composed of "0" and "1";

output means for outputting the code data by a predetermined number of bits in parallel and carry-over data of one bit indicating whether there is a carry-over;

determining means for determining whether or not all bits of the code data of the predetermined number of bits are "1"s and outputting determination data of one bit indicating whether all bits are "1";

a plurality of serially connected code latch means, each of which latches the code data of the predetermined number of bits, the code data of the predetermined number of bits being shifted in parallel through said plurality of code latch means;

a plurality of serially connected first data latch means, each of which latches the carry-over data of one bit corresponding to each of said plurality of code latch means, the carry-over data of one bit being shifted through said plurality of first data latch means in synchronism with the parallel shift of the code data of the predetermined number of bits through the plurality of code latch means;

a plurality of serially connected second data latch means, each of which latches the determination data of one bit corresponding to each of said plurality of code latch means, the determination data of one bit being shifted through said plurality of second data latch means in synchronism with the parallel shift of the code data of the predetermined number of bits through the plurality of code latch means;

carry-over process means for effecting a carry-over process on the code data latched in said plurality of code latch means based on the carry-over data latched in said plurality of first data latch means and the determination data latched in said plurality of second latch means; and adding means for adding the carry-over data of one-bit shifted through said plurality of first data latch means and the code data of the predetermined number of bits shifted in parallel through said plurality of code latch means, so as to output a result of the addition as established code data of the predetermined number of bits.

2. A device according to claim 1, wherein said carry-over process means effects the carry-over process on the code data latched in said code latch means corresponding to said second data latch means which latches the determination data indicating that all bits of the code data are "1"s in accordance with the carry-over data latched in said first data latch means.

3. A device according to claim 2, wherein in a case where the carry-over data is output from said outputting means after the code data of which all bits are "1"s is output from said outputting means and is latched in a first stage of said code latch means, said carry-over process means causes a second stage of said code latch means to latch code data of which all bits are "0"s and causes said first data latch means corresponding to the second stage of said code latch means to latch the carry-over data.

4. A device according to claim 2, wherein in a case where the carry-over data is latched in said first data latch means corresponding to said code latch means before said code latch means which latches the code data of which all bits are "1"s, said carry-over process means causes said code latch means which latches the code data of which all bits are "1" to latch code data of which all bits are "0"s and causes said data latch means corresponding to said code latch means which is caused to latch the code data of which all bits are "0"s to latch the carry-over data.

5. An image encoding device comprising:

encoding means for encoding image data based on an arithmetic code to generate code data composed of "0" and "1";

output means for outputting the code data by a predetermined number of bits in parallel and carry-over data of one bit indicating whether there is a carry-over;

a plurality of serially connected code latch means, each of which latches the code data of the predetermined number of bits, the code data of the predetermined number of bits being shifted in parallel through said plurality of code latch means;

a plurality of serially connected data latch means, each of which latches the carry-over data of one bit corresponding to each of said plurality of code latch means, the carry-over data of one bit being shifted through said plurality of data latch means in synchronism with the parallel shift of the code data of the predetermined number of bits through the plurality of code latch means:

a plurality of determining means, each of which determines whether or not all bits of the code data of the predetermined number of bits latched in an associated one of said plurality of code latch means are "1"s;

carry-over process means for effecting a carry-over process on the code data latched in said plurality of code latch means based on the carry-over data latched in said plurality of data latch means and the determination results of said plurality of determining means; and adding means for adding the carry-over data of one bit shifted through said plurality of data latch means and the code data of the predetermined number of bits shifted in parallel through said plurality of code latch means, so as to output a result of the addition as established code data of the predetermined number of bits.

6. A device according to claim 5, wherein said carry-over process means effects the carry-over process on the code data of which all bits are "1"s in accordance with the determination of said plurality of determining means.

7. An image encoding method comprising:

an encoding step of encoding image data based on an arithmetic code to generate code data composed of "0" and "1";

an output step of outputting the code data by a predetermined number of bits in parallel and carry-over data of one bit indicating whether there is a carry-over;

a determining step of determining whether or not all bits of the code data of the predetermined number of bits are "1"s and outputting determination data of one bit indicating whether all bits are "1";

a first shifting step of shifting in parallel the code data of the predetermined number of bits through a plurality of serially connected code latch devices, each of which latches the code data of the predetermined number of bits;

a second shifting step of shifting the carry-over data of one bit through a plurality of serially connected first data latch devices in synchronism with the parallel shift of the code data of the predetermined number of bits through the plurality of code latch devices, each of which first data latch devices latches the carry-over data of one bit;

a third shifting step of shifting the determination data of one bit through a plurality of serially connected second data latch devices in synchronism with the parallel shift of the code data of the predetermined number of bits through the plurality of code latch devices, each of which second data latch devices latches the determination data of one bit;

a carry-over process step of effecting a carry-over process on the code data latched in the plurality of code latch devices based on the carry-over data latched in the plurality of first data latch devices and the determination data latched in the plurality of second latch devices: and an adding step of adding the carry-over data of one bit shifted through the plurality of first data latch devices and the code data of the predetermined number of bits shifted in parallel through the plurality of code latch devices, so as to output a result of the addition as established code data of the predetermined number of bits.

8. A method according to claim 7, wherein the carry-over process step effects the carry-over process on the code data latched in the code latch device corresponding to the second data latch device which latches the determination data indicating that all bits of the code data are "1"s in accordance with the carry-over data latched in the first data latch devices.

9. A method according to claim 8, wherein in a case where the carry-over data is output in said output step after the code data of which all bits are "1"s is output in said output step and is latched in a first stage of the code latch device, said carry-over process step causes a second stage of the code latch device to latch the code data of which all bits are "0"s and causes the first data latch device corresponding to the second stage of the code latch device to latch the carry-over data.

10. A method according to claim 8, wherein in a case where the carry-over data is latched in the first data latch device corresponding to the code latch device before the code latch device which latches the code data of which all bits are "1"s, said carry-over process step causes the code latch device which latches the code data of which all bits are "1" to latch code data of which all bits are "0"s and causes the first data latch device corresponding to the code latch device which is caused to latch the code data of which all hits are "0"s to latch the carry-over data.

11. An image encoding method comprising:

an encoding step of encoding image data based on an arithmetic code to generate code data composed of "0" and "1";

an output step of outputting the code data by a predetermined number of bits in parallel and carry-over data of one bit indicating whether there is a carry-over;

a first shifting step of shifting in parallel the code data of the predetermined number of bits through a plurality of serially connected code latch devices, each of which latches the code data of the predetermined number of bits;

a second shifting step of shifting the carry-over data of one bit through a plurality of serially connected data latch devices in synchronism with the parallel shift of the code data of the predetermined number of bits through the plurality of code latch devices, each of which data latch devices latches the carry-over data of one bit.

a determining step of determining whether or not all bits of the code data of the predetermined number of bits latched in each of the plurality of code latch devices are "1"s;

a carry-over process step of effecting a carry-over process on the code data latched in the plurality of code latch devices in accordance with the carry-over data latched in the plurality of data latch devices and the determination results of said determining step; and an adding step of adding the carry-over data of one bit shifted through the plurality of data latch devices and the code data of the predetermined number of bits shifted in parallel through the plurality of code latch devices, so as to output a result of the addition as established code data of the predetermined number of bits.

12. A method according to claim 11, wherein said carry-over process step effects the carry-over process on the code data of which all bits are "1"s in accordance with the determination result of said determining step and the carry-over data latched in the data latch devices.

13. A method according to claim 11, wherein in a case where the carry-over data is output in said output step after the code data of which all bits are "1"s is output in said output step and is latched in a first state of the code latch device, said carry-over process step causes a second stage of the code latch device to latch code data of which all bits are "0"s.

14. A method according to claim 11, wherein in a case where the carry-over data is latched in the data latch device corresponding to the code latch device before the code latch device which latches the code data of which all bits are "1"s, said carry-over process step causes the code latch device which latches the code data of which all bits are "1" to latch code data of which all bits are "0"s.

15. A device according to claim 5, wherein in a case where the carry-over data is output from said outputting means after the code data of which all bits are "1"s is output from said outputting means and is latched in a first stage of said code latch means, said carry-over process means causes a second stage of said code latch means to latch code data of which all bits are "0"s.

16. A device according to claim 5, wherein in a case where the carry-over data is latched in said data latch means corresponding to said code latch means before said code latch means which latches the code data of which all bits are "1"s, said carry-over process means causes said code latch means which latches the code data of which all bits are "1" to latch code data of which all bits are "0"s.

* * * * *

UNITED STATES PATENT AND TRADEMARK OFFICE
CERTIFICATE OF CORRECTION

PATENT NO. : 5,784,497

DATED : July 21, 1998

INVENTOR(S) : KEIJI ISHIZUKA, et al.                    Page 1 of 2

It is certified that error appears in the above-identified patent and that said Letters Patent is hereby corrected as shown below:

ON THE COVER PAGE
Change the title to read --ARITHMETIC ENCODING WITH CARRY-OVER PROCESSING--.

COLUMN 1
Lines 1-2, change the title to read --ARITHMETIC ENCODING WITH CARRY-OVER PROCESSING--.

COLUMN 2
Line 53, "outputted" should read --output--.

COLUMN 3
Line 57, "there is not outputted" should be deleted.

COLUMN 6
Line 62, "be" (first occurrence) should be deleted.

COLUMN 12
Line 53, "means:" should read --means;--.

COLUMN 13
Line 44, "devices:" should read --devices;--

UNITED STATES PATENT AND TRADEMARK OFFICE
CERTIFICATE OF CORRECTION

PATENT NO. : 5,784,497

DATED : July 21, 1998

INVENTOR(S) : KEIJI ISHIZUKA, et al.

It is certified that error appears in the above-identified patent and that said Letters Patent is hereby corrected as shown below:

<u>COLUMN 14</u>
Line 29, "bit," should read --bit;--.

Signed and Sealed this

Nineteenth Day of October, 1999

Attest:

Q. TODD DICKINSON

Attesting Officer

Acting Commissioner of Patents and Trademarks